United States Patent
Chao et al.

(10) Patent No.: US 9,978,678 B1
(45) Date of Patent: May 22, 2018

(54) VERTICALLY INTEGRATED NANOSHEET FUSE

(71) Applicant: International Business Machines Corporation, Armonk, NY (US)

(72) Inventors: Robin H. Chao, Wappingers Falls, NY (US); James J. Demarest, Rensselaer, NY (US); Nicolas J. Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/422,544

(22) Filed: Feb. 2, 2017

(51) Int. Cl.
| | |
|---|---|
| *H01L 23/525* | (2006.01) |
| *H01L 23/532* | (2006.01) |
| *H01L 21/265* | (2006.01) |
| *H01L 21/306* | (2006.01) |
| *H01L 29/66* | (2006.01) |
| *H01L 29/786* | (2006.01) |

(52) U.S. Cl.
CPC ........ *H01L 23/5256* (2013.01); *H01L 21/265* (2013.01); *H01L 21/30604* (2013.01); *H01L 23/53209* (2013.01); *H01L 23/53252* (2013.01); *H01L 23/53266* (2013.01); *H01L 23/53271* (2013.01)

(58) Field of Classification Search
CPC .......... H01L 23/5256; H01L 23/53209; H01L 23/53252; H01L 23/53266; H01L 23/53271; H01L 21/265; H01L 21/30604
USPC ...... 257/529, 401, 9, 15, 288, 329, E23.149, 257/E29.056, E29.063, E29.075, E29.266, 257/E29.325; 438/268, 279
See application file for complete search history.

(56) References Cited

U.S. PATENT DOCUMENTS

| | | | |
|---|---|---|---|
| 7,575,958 | B2 | 8/2009 | Hoefler et al. |
| 8,004,059 | B2 | 8/2011 | Kim et al. |
| 8,299,570 | B2 | 10/2012 | Kim et al. |
| 8,329,515 | B2 | 12/2012 | Yang et al. |
| 8,609,485 | B2 | 12/2013 | Kurz et al. |
| 8,742,766 | B2 | 6/2014 | Bonilla et al. |
| 8,896,088 | B2 | 11/2014 | Li et al. |
| 2007/0082431 | A1 | 4/2007 | Hoefler et al. |
| 2008/0169529 | A1 | 7/2008 | Kim et al. |
| 2010/0181643 | A1 | 7/2010 | Kothandaraman et al. |

(Continued)

OTHER PUBLICATIONS

List of IBM Patents or Patent Applications Treated as Related (Appendix P); Filed Feb. 2, 2017, 2 pages.

(Continued)

*Primary Examiner* — Dao H Nguyen
(74) *Attorney, Agent, or Firm* — Cantor Colburn LLP; Vazken Alexanian

(57) ABSTRACT

Embodiments are directed to a method and resulting structures for forming a semiconductor device having a vertically integrated nanosheet fuse. A nanosheet stack is formed on a substrate. The nanosheet stack includes a semiconductor layer formed between an upper nanosheet and a lower nanosheet. The semiconductor layer is modified such that an etch rate of the modified semiconductor layer is greater than an etch rate of the upper and lower nanosheets when exposed to an etchant. Portions of the modified semiconductor layer are removed to form a cavity between the upper and lower nanosheets and a silicide region is formed in the upper nanosheet.

4 Claims, 9 Drawing Sheets

(56) References Cited

U.S. PATENT DOCUMENTS

| | | | |
|---|---|---|---|
| 2011/0272779 A1 | 11/2011 | Kim et al. | |
| 2014/0042386 A1* | 2/2014 | Cea | H01L 29/42392 257/9 |
| 2015/0194528 A1* | 7/2015 | Okano | H01L 29/42392 257/401 |
| 2015/0325648 A1* | 11/2015 | Cea | H01L 29/42392 438/283 |
| 2016/0181362 A1* | 6/2016 | Yang | H01L 29/0649 257/329 |
| 2016/0284536 A1* | 9/2016 | Fukui | B82Y 10/00 |
| 2017/0148900 A1* | 5/2017 | Leobandung | H01L 29/66742 |

OTHER PUBLICATIONS

Robin H. Chao, et al. "Vertically Integrated Nanosheet Fuse," U.S. Appl. No. 15/810,940, filed Nov. 13, 2017.
Saad et al. "Mitigating Breakdown Voltage with Dual Channel Vertical Strained SiGe Impact Ionization MOSFET (VESIMOS)." Artificial Intelligence, Modelling and Simulation (AIMS), 2013 1st International Conference on. IEEE, 2013, pp. 423-427.

* cited by examiner

VERTICALLY INTEGRATED NANOSHEET FUSE

BACKGROUND

The present invention relates in general to semiconductor device fabrication methods and resulting structures. More specifically, the present invention relates to fabrication methods and resulting structures for a semiconductor device having a vertically integrated nanosheet fuse.

In contemporary semiconductor device fabrication processes a large number of semiconductor devices, such as field effect transistors (FETs) and electrically operable fuses, are fabricated on a single wafer. Electrically operable fuses are utilized in integrated circuits for a number of purposes, including the programming of alterable circuit connections, the replacement of defective circuit elements, and the storage of initial device configuration data. Electrically operable fuses are typically arranged in arrays, wherein each fuse array includes multiple fuses, and wherein each fuse in the fuse array can be individually selected and programmed. By activating a particular row and column of the fuse array, an individual fuse can be selected and programmed by providing a sufficient voltage across the fuse, thereby causing it to break down. The voltage at which a particular fuse will break down is known as the break down voltage.

SUMMARY

According to one or more embodiments of the present invention, a method of forming a semiconductor device having a vertically integrated nanosheet fuse is provided. The method includes forming a nanosheet stack on a substrate. The nanosheet stack includes a semiconductor layer formed between an upper nanosheet and a lower nanosheet. The method further includes modifying the semiconductor layer such that an etch rate of the modified semiconductor layer is greater than an etch rate of the upper and lower nanosheets when exposed to an etchant. The method further includes removing portions of the modified semiconductor layer to form a cavity between the upper and lower nanosheets. The method further includes forming a silicide region in the upper nanosheet.

According to one or more embodiments of the present invention, a method of forming a plurality of semiconductor devices each having a vertically integrated nanosheet fuse is provided. The method includes forming a plurality of nanosheet stacks on a substrate. Each nanosheet stack includes a semiconductor layer formed between an upper nanosheet and a lower nanosheet. The method further includes modifying the semiconductor layer of each nanosheet stack such that an etch rate of each modified semiconductor layer is greater than an etch rate of the upper and lower nanosheets when exposed to an etchant. The method further includes removing portions of each modified semiconductor layer to form a cavity between the upper and lower nanosheets of each nanosheet stack. The method further includes forming a silicide region in the upper nanosheet of each nanosheet stack.

According to one or more embodiments of the present invention, a semiconductor device having a vertically integrated nanosheet fuse is provided. The structure includes a nanosheet stack formed on a substrate. The nanosheet stack includes a semiconductor layer formed on a surface of the substrate, a nanosheet formed on the semiconductor layer, a modified semiconductor layer formed on the nanosheet, and a silicide region formed on the modified semiconductor layer. The structure further includes a silicide layer formed on the substrate and adjacent to the nanosheet stack. The structure further includes a first conductive contact formed on a surface of the silicide region and a second conductive contact formed on a surface of the silicide layer.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
FIG. 1 depicts a cross-sectional view of a structure having nanosheets formed on a substrate during an intermediate operation of a method of fabricating a semiconductor device according to one or more embodiments of the present invention.

Various embodiments of the present invention are described herein with reference to the related drawings.

Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" (e.g., a conformal layer) means that the thickness of the layer is substantially the same on all surfaces, or that the thickness variation is less than 15% of the nominal thickness of the layer.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.)

are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, electrically operable fuses are utilized for a wide variety of purposes. There are challenges, however, in providing electrically operable fuses for scaling beyond the 10 nm node. As semiconductor device critical dimensions continuously scale downward, and as the number of functions for a given semiconductor device increases, the number of fuses required for performing all of the functions also increases. Conventional planar electrically operable fuses require a relatively large on-die footprint. While fuse array structures have been introduced to manage a large number of planar fuses more efficiently, chip fabricators still face challenges when attempting to optimize the chip area and power load consumed by the electrically operable fuses of a particular IC design.

Turning now to an overview of the aspects of the present invention, one or more embodiments provide methods of forming vertically integrated nanosheet fuses. The vertically integrated nanosheet fuses provide increased device density and improved performance over conventional planar fuses. A nanosheet stack having alternating semiconductor layers is formed over a substrate. A nanosheet layer of the nanosheet stack is modified with respect to the other nanosheet layers (herein "modifying" a layer means forming, amorphizing, damaging, enriching, or otherwise modifying the layer such that a lateral etch rate of the modified layer when exposed to an etchant is greater than a lateral etch rate of the remaining, unmodified nanosheet layers). The modified layer is then partially removed (defining, e.g., a fuse region). The final material characteristics in the fuse region can be tuned to adjust the break down voltage of the resultant vertically integrated nanosheet fuse. A silicide region is formed over the fuse region and a conductive contact is formed over the silicide region. The process can be used to create any number of vertically integrated nanosheet fuses. In this manner, an addressable vertically integrated front end of line (FEOL) nanosheet fuse array can be formed having a relatively small footprint (compared, e.g., to conventional planar fuse arrays).

Example methods for forming a semiconductor device having vertically integrated nanosheet fuses and the resulting structures therefrom in accordance with embodiments of the present invention are described in detail below by referring to the accompanying drawings in FIGS. 1-9.

FIG. 1 illustrates a cross-sectional view of a structure 100 having nanosheets 102, 104, and 106 formed on a substrate 108 during an intermediate operation of a method of fabricating a semiconductor device according to one or more embodiments. The nanosheets 102, 104, and 106 alternate with semiconductor layers 110, 112, and 114. In some embodiments, the nanosheets 102, 104, and 106 and the semiconductor layers 110, 112, and 114 are epitaxially grown films, such as, for example, monocrystalline silicon (Si), germanium (Ge), or silicon germanium (SiGe). In some embodiments, the epitaxially grown films are formed from gaseous or liquid precursors. In some embodiments, epitaxial regions are epitaxially grown over the substrate 108.

The terms "epitaxial growth", "epitaxial deposition" and/or "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed non-semiconductor surfaces, such as silicon dioxide or silicon nitride surfaces.

Epitaxial semiconductor materials can be grown using vapor-phase epitaxy (VPE), MBE, liquid-phase epitaxy (LPE), or other suitable processes. In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

The epitaxially grown films can be etched using, e.g., a direction RIE, to form the nanosheets 102, 104, and 106. For ease of discussion reference is made to operations performed on and to nanosheet stacks having three nanosheets (e.g., nanosheets 102, 104, and 106) alternating with three semiconductor layers (e.g., semiconductor layers 110, 112, and 114). It is understood, however, that the nanosheet stack can include any number of nanosheets alternating with a corresponding number of semiconductor layers. For example, the nanosheet stack can include a single nanosheet, two nanosheets, five nanosheets, eight nanosheets, or any number of nanosheets, along with a corresponding number of semiconductor layers (i.e., as appropriate to form a nanosheet stack having a bottommost semiconductor layer under a bottommost nanosheet and a semiconductor layer between each pair of adjacent nanosheets).

The nanosheets 102, 104, and 106 can be made of any suitable material such as, for example, Si or SiGe. In some embodiments, the nanosheets 102, 104, and 106 are nFET nanosheets. In some embodiments, the nFET nanosheets are Si nFET nanosheets. In some embodiments, the nanosheets 102, 104, and 106 have a thickness of about 4 nm to about 10 nm, although other thicknesses are within the contemplated scope of the invention. In yet other embodiments, the nanosheets 102, 104, and 106 have a thickness of about 6 nm.

The substrate 108 can be made of any suitable substrate material, such as, for example, monocrystalline Si, SiGe, SiC, III-V compound semiconductor, II-VI compound semiconductor, or semiconductor-on-insulator (SOI). In some embodiments, the substrate 108 includes a buried oxide layer (not depicted). In some embodiments, the substrate 108 includes both an nFET region and a pFET region. In some embodiments, the substrate 108 includes either an nFET region or a pFET region.

In some embodiments, the semiconductor layers 110, 112, and 114 can be Si or SiGe. In embodiments where the nanosheets 102, 104, and 106 are Si nFET nanosheets, the semiconductor layers 110, 112, and 114 are SiGe semiconductor layers. In some embodiments, the semiconductor layers 110, 112, and 114 have a thickness of about 6 nm to about 20 nm, although other thicknesses are within the contemplated scope of the invention. In yet other embodiments, the semiconductor layers 110, 112, and 114 have a thickness of about 10 nm.

Figure 2:
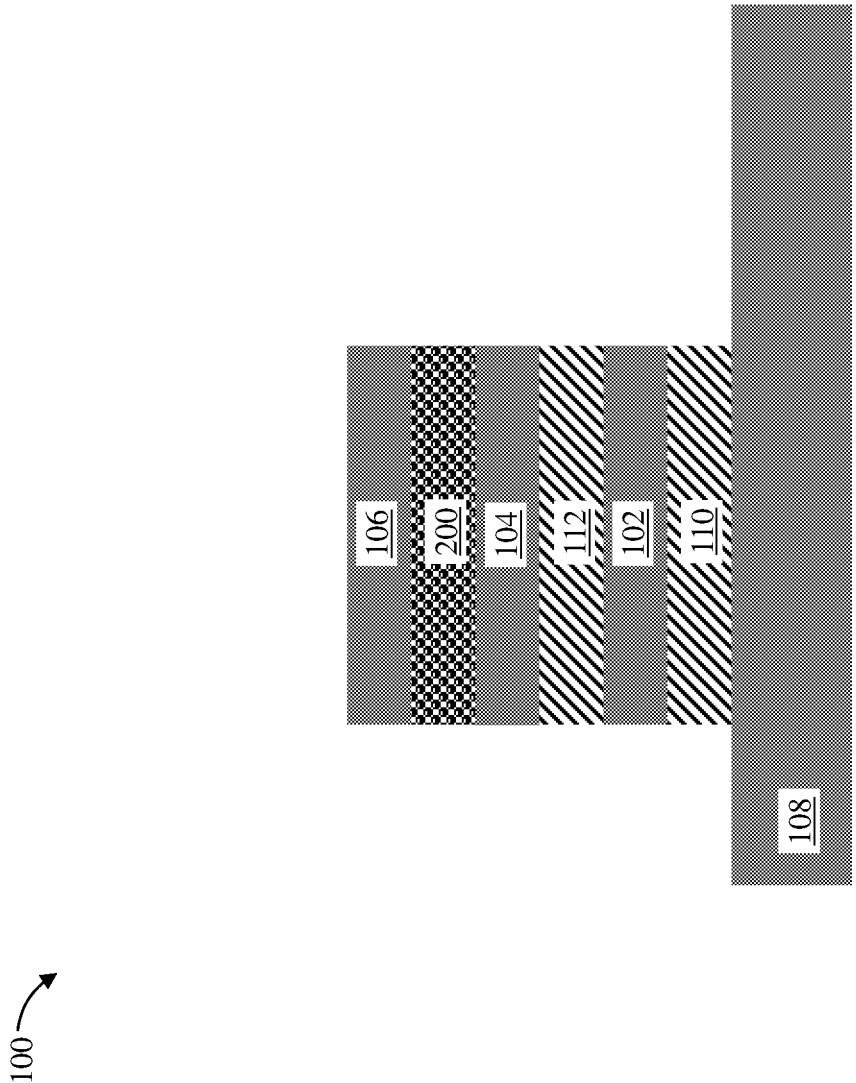
FIG. 2 depicts a cross-sectional view of the structure after forming a modified layer in the nanosheet stack during an intermediate operation of a method of fabricating a semiconductor device according to one or more embodiments of the present invention.

FIG. 2 illustrates a cross-sectional view of the structure 100 after forming a modified layer 200 in the nanosheet stack during an intermediate operation of a method of fabricating a semiconductor device according to one or more embodiments. The modified layer 200 can be formed using, for example, in-situ doping (e.g., the semiconductor layer 114, as depicted in FIG. 1, can be doped during deposition), plasma doping at a temperature of greater than about 400 degrees Celsius, diffusion, gas phase doping, solid phase doping, and ion implantation, or by epitaxially growing the modified layer 200 using a material having different etch characteristics than the nanosheets 102, 104, or 106 and the remaining semiconductor layers (e.g., semiconductor layers 110 and 112). In some embodiments, the modified layer 200 is formed by implanting a dopant into the semiconductor layer 114. In some embodiments, the modified layer 200 is formed by in-situ doping the semiconductor layer 114. In some embodiments, the modified layer 200 is formed by damaging the semiconductor layer 114 (e.g., amorphizing the semiconductor layer 114 or enriching the semiconductor layer 114 with, for example, Ge). Epitaxial silicon, silicon germanium, and/or carbon doped silicon (Si:C) can be doped during deposition (in-situ doped) by adding n-type dopants (e.g., phosphorus or arsenic) or p-type dopants (e.g., boron or gallium). The dopant concentration in the modified layer 200 can range from $1\times10^{19}$ $cm^{-3}$ to $2\times10^{21}$ $cm^{-3}$, or between $2\times10^{20}$ $cm^{-3}$ and $1\times10^{21}$ $cm^{-3}$. For ease of discussion reference is made to operations performed on and to the semiconductor layer 114 (i.e., the topmost semiconductor layer). It is understood, however, that any of the semiconductor layers can be modified using, e.g., one or more embodiments of the present invention in combination with known masking techniques.

The modification process is selected such that a lateral etch rate of the modified layer 200 when exposed to an etchant is greater than a lateral etch rate of the nanosheets 102, 104, and 106 and the semiconductor layers 110 and 112 when exposed to the same etchant. In some embodiments, the modified layer 200 is formed using a Si or Ge dopant, although other dopants such as phosphorus (P) or arsenic (As) are within the contemplated scope of the invention. In this manner, the modified layer 200 can be removed at a faster rate than the nanosheets 102, 104, and 106 and the semiconductor layers 110 and 112.

In some embodiments, the semiconductor layers 110, 112, and 114 are SiGe layers, the nanosheets 102, 104, and 106 are Si layers, and the modified layer 200 is formed using a Ge dopant—increasing the Ge concentration of the modified layer 200 relative to the remaining semiconductor layers 110 and 112. In some embodiments, the modified layer 200 is formed using a Si dopant—decreasing the Ge concentration of the modified layer 200 relative to the remaining semiconductor layers 110 and 112.

In this manner, the Ge concentration in the modified layer 200 can be tuned to adjust the break down voltage of the resultant nanosheet fuse. A Ge concentration of about 10 percent provides a nanosheet fuse having a break down voltage of about 2.9V. A Ge concentration of about 20 percent provides a nanosheet fuse having a break down voltage of about 2.8V. A Ge concentration of about 30 percent provides a nanosheet fuse having a break down voltage of about 2.5V. It is understood that other desirable breakdown voltages can be achieved by similarly adjusting the Ge concentration in the modified layer 200.

Figure 3:
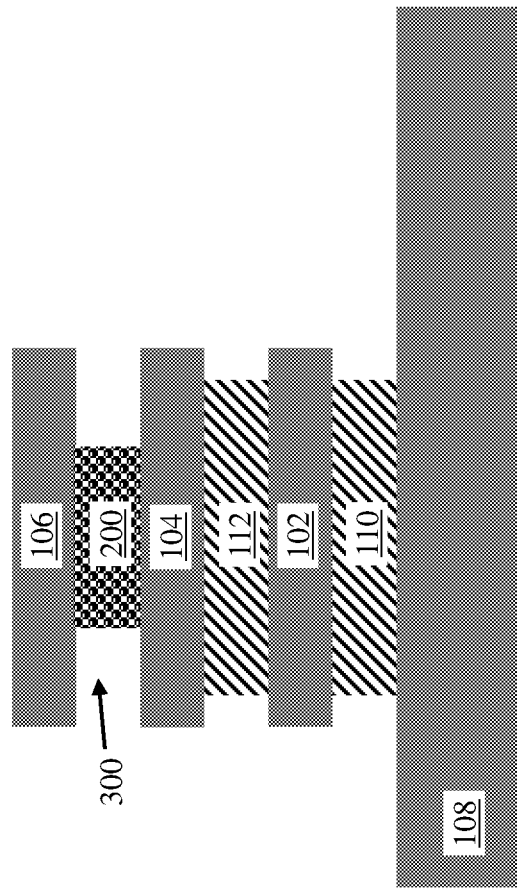
FIG. 3 depicts a cross-sectional view of the structure after laterally etching the modified layer and the semiconductor layers to form cavities between the nanosheets during an intermediate operation of a method of fabricating a semiconductor device according to one or more embodiments of the present invention.

FIG. 3 illustrates a cross-sectional view of the structure 100 after laterally etching the modified layer 200 and the semiconductor layers 110 and 112 to form cavities between the nanosheets 102, 104, and 106 (i.e., the cavity 300 between the nanosheets 106 and 104) during an intermediate operation of a method of fabricating a semiconductor device according to one or more embodiments. Any known manner of laterally etching the modified layer 200 and the semiconductor layers 110 and 112 can be used, such as, for example, exposing the modified layer 200 and the semiconductor layers 110 and 112 to a wet etchant selective to the nano sheets 102, 104, and 106. As discussed previously herein, the lateral etch rate of the modified layer 200 when exposed to the etchant is greater than a lateral etch rate of the nanosheets 102, 104, and 106 and the semiconductor layers 110 and 112 when exposed to the same etchant. Consequently, the remaining portions of the modified layer 200 will be thinner (i.e., will have a shorter cross-sectional length) than the remaining portions of the semiconductor layers 110 and 112.

Figure 4:
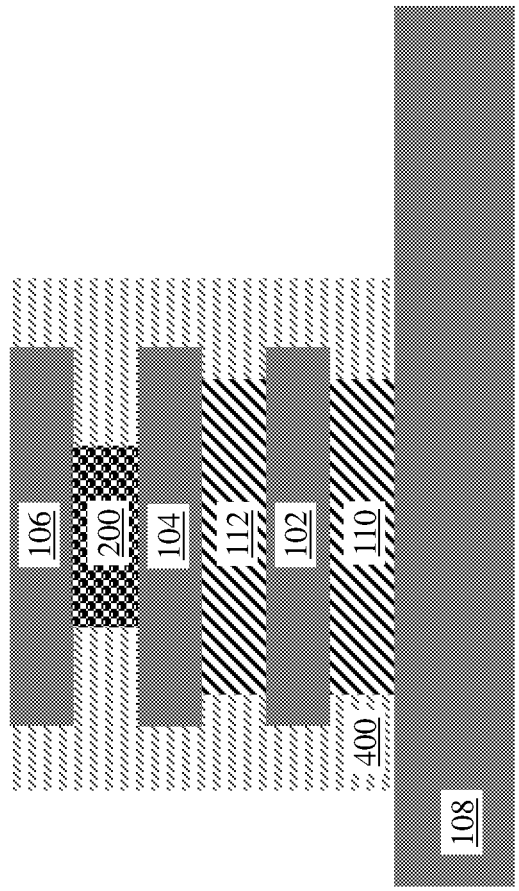
FIG. 4 depicts a cross-sectional view of the structure after forming a spacer over the nanosheet stack and the substrate during an intermediate operation of a method of fabricating a semiconductor device according to one or more embodiments of the present invention.

FIG. 4 illustrates a cross-sectional view of the structure 100 after forming a spacer 400 over the nanosheet stack and the substrate 108 during an intermediate operation of a method of fabricating a semiconductor device according to one or more embodiments. The spacer 400 replaces the material that was removed during the lateral etch of the modified layer 200 (i.e., portions of the spacer 400 fill the cavity 300). In some embodiments, the spacer 400 is are formed using a CVD, PECVD, ALD, PVD, chemical solution deposition, or other like processes in combination with a wet or dry etch process. The spacer 400 can be made of any suitable material, such as, for example, a low-k dielectric, a nitride, silicon nitride (SiN), silicon dioxide ($SO_2$), a silicon oxynitride (SiON), a silicon carbide (SiC), a silicon oxygen carbonitride (SiOCN), or a siliconboron carbonitride (SiBCN). In some embodiments, the spacer 400 is planarized to a top surface of the nanosheet 106, using, for example, a CMP operation or a wet or dry etch process. In some embodiments, a wet or dry etch selective to the nanosheet 106 is used.

Figure 5:
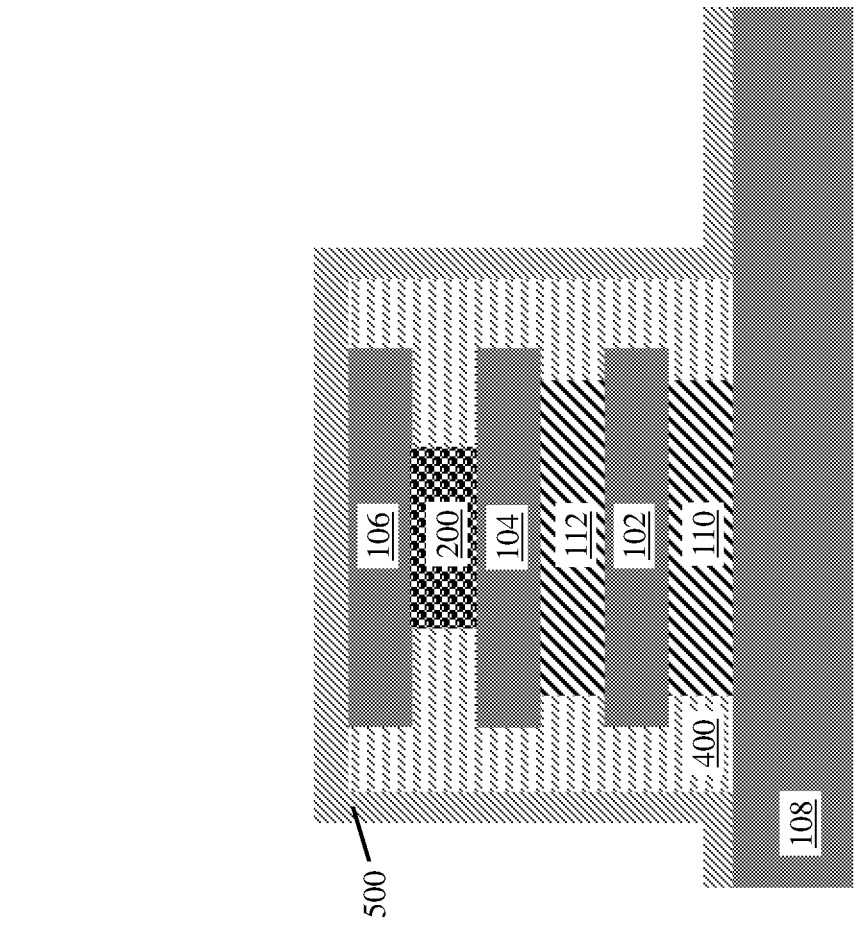
FIG. 5 depicts a cross-sectional view of the structure after forming a conformal liner over the nanosheet stack and the substrate during an intermediate operation of a method of fabricating a semiconductor device according to one or more embodiments of the present invention.

FIG. 5 illustrates a cross-sectional view of the structure 100 after forming a conformal liner 500 over the nanosheet stack (e.g., the nanosheets 102, 104, and 106) and the substrate 108 during an intermediate operation of a method of fabricating a semiconductor device according to one or more embodiments. The conformal liner 500 can include any electropositive elements suitable for forming a silicide when annealed in contact with silicon. In some embodiments, the conformal liner 500 is a metal liner made of, for example, nickel (Ni), titanium (Ti), or platinum (Pt). The conformal liner 500 can be formed using, for example, CVD, PECVD, ALD, flowable CVD, or PVD. In some embodiments, the conformal liner 500 is conformally formed using ALD to a thickness of about 3 nm to about 20 nm, although other thicknesses are within the contemplated scope of the invention.

Figure 6:
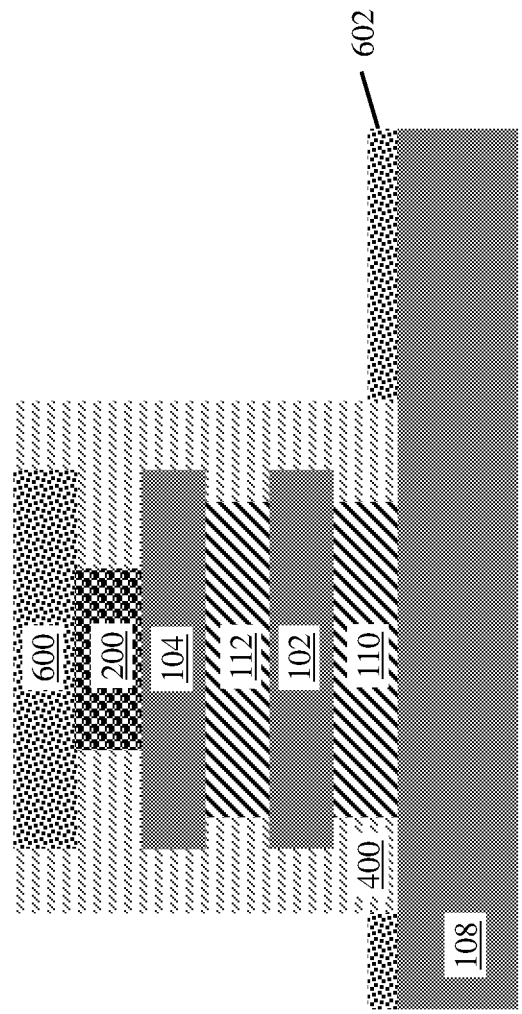
FIG. 6 depicts a cross-sectional view of the structure after annealing the structure to form a silicide region and a silicide layer during an intermediate operation of a method of fabricating a semiconductor device according to one or more embodiments of the present invention.

FIG. 6 illustrates a cross-sectional view of the structure 100 after annealing the structure 100 to form a silicide region 600 and a silicide layer 602 during an intermediate operation of a method of fabricating a semiconductor device according to one or more embodiments. During the annealing process the silicide region 600 is formed where portions of the conformal liner 500 contact a surface of the nanosheet 106 (i.e., portions of the conformal liner 500 and the nanosheet 106 react during the annealing process to form the silicide region 600). In a similar manner, the silicide layer 602 is formed where portions of the conformal liner 500 contact the substrate 108. Any suitable annealing process known for forming silicides can be used, such as, for example, a RTA or spike annealing process at a temperature of about 200 degrees Celsius to about 300 degrees Celsius for a duration of less than about 10 seconds. In this manner, silicide formation can be confined to the silicide region 600 and the silicide layer 602 (i.e., the silicide region 600 is "self-aligned" to the nanosheet 106). A silicide prepared by a self-aligned process is also referred to as a salicide. In embodiments where the conformal liner 500 includes Ni, the silicide region 600 and the silicide layer 602 are nickel silicides (NiSi).

The unreacted silicide (i.e., portions of the conformal liner 500 in contact with the spacer 400) is stripped from the structure 100 using any suitable process known for removing unreacted metals following a silicidation. In some embodiments, a wet or dry etch process is used. In some embodiments, the conformal liner 500 includes Ti and the unreacted portions of the conformal liner 500 are removed using an ammonium hydroxide (NH$_4$OH) etch. In some embodiments, the conformal liner 500 includes Co or Ni and the unreacted portions of the conformal liner 500 are removed using a hydrochloric acid (HCl) etch, which can include a mixture of hydrochloric acid, hydrogen peroxide (H$_2$O$_2$), sulfuric acid (H$_2$SO$_4$), and water. In other embodiments, unreacted Co or Ni is exposed to a plasma containing carbon monoxide gas that removes the unreacted portions of the conformal liner 500.

Figure 7:
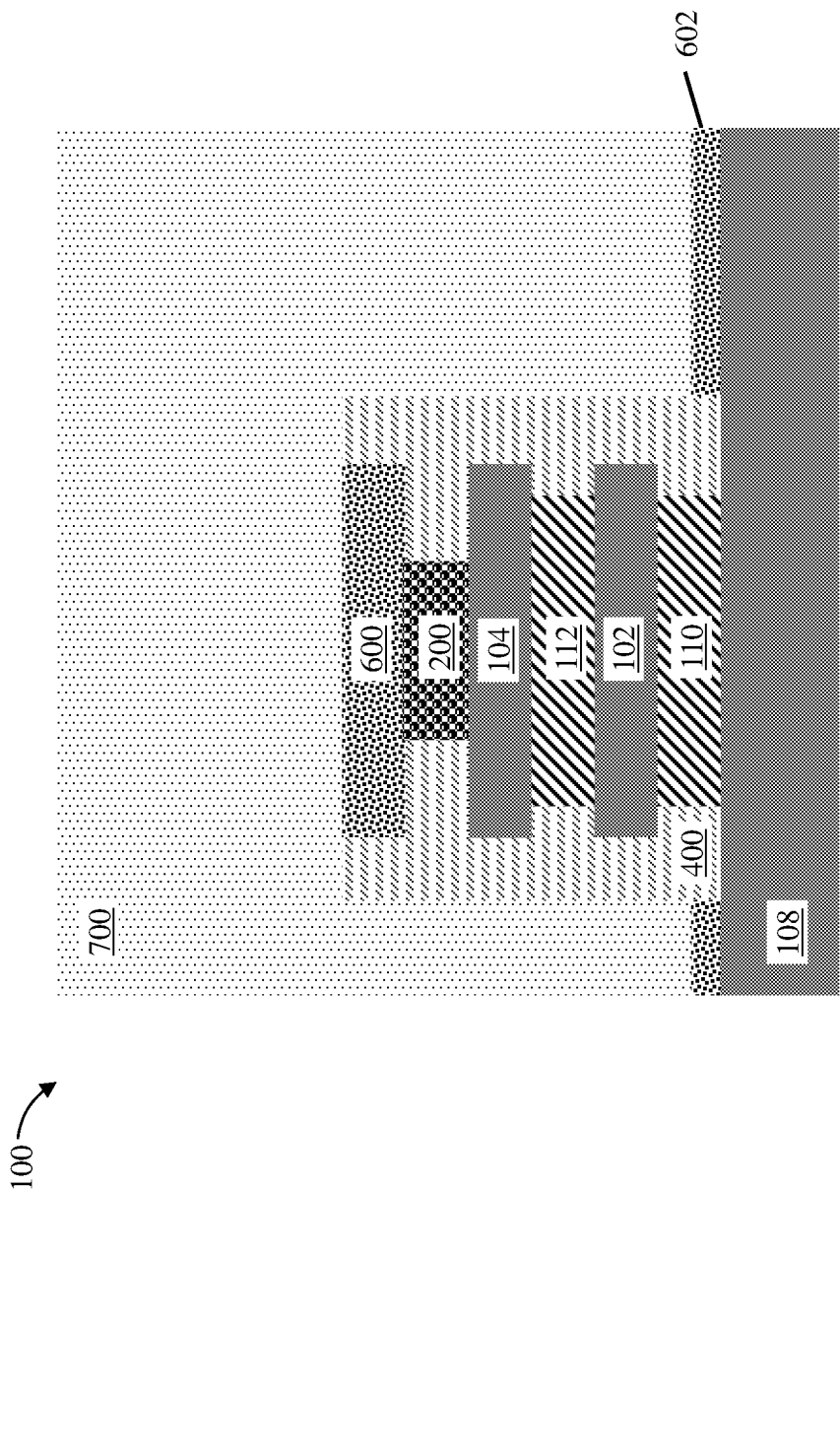
FIG. 7 depicts a cross-sectional view of the structure after forming a dielectric region over the silicide region, the spacer, and the silicide layer during an intermediate operation of a method of fabricating a semiconductor device according to one or more embodiments of the present invention.

FIG. 7 illustrates a cross-sectional view of the structure 100 after forming a dielectric region 700 over the silicide region 600, the spacer 400, and the silicide layer 602 during an intermediate operation of a method of fabricating a semiconductor device according to one or more embodiments. The dielectric region 700 can be made of any suitable material, such as, for example, porous silicates, carbon doped oxides, silicon dioxides, silicon nitrides, silicon oxynitrides, or other dielectric materials. Any known manner of forming the dielectric region 700 can be utilized. The dielectric region 700 can be formed using, for example, CVD, PECVD, ALD, flowable CVD, spin-on dielectrics, or PVD. In some embodiments, the dielectric region 700 is planarized, using, for example, a CMP operation.

Figure 8:
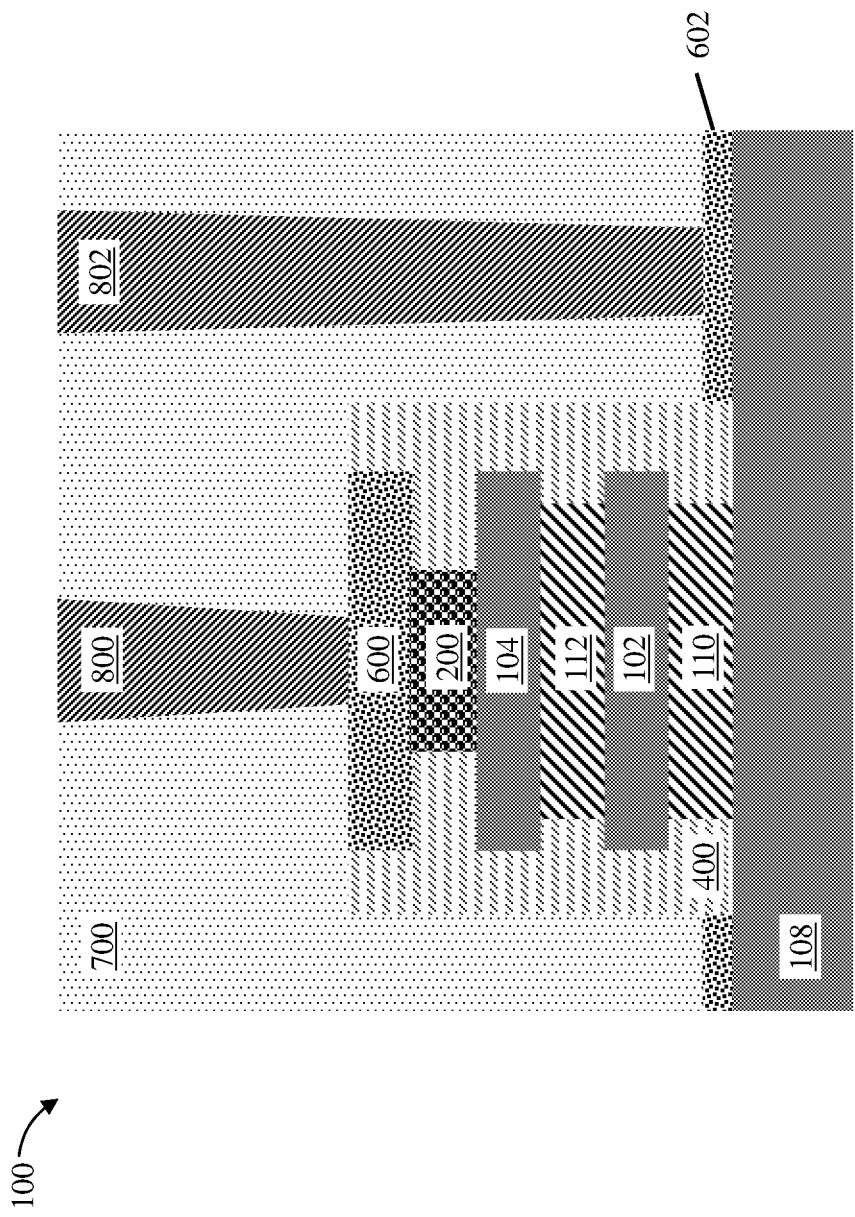
FIG. 8 depicts a cross-sectional view of the structure after forming conductive contacts in the dielectric region during an intermediate operation of a method of fabricating a semiconductor device according to one or more embodiments of the present invention.

FIG. 8 illustrates a cross-sectional view of the structure 100 after forming conductive contacts 800 and 802 in the dielectric region 700 during an intermediate operation of a method of fabricating a semiconductor device according to one or more embodiment. The conductive contact 800 is formed over and in direct contact with a surface of the silicide region 600. The conductive contact 802 is formed over and in direct contact with a surface of the silicide layer 602. The contacts 800 and 802 can be formed using known metallization techniques. In some embodiments, the dielectric region 700 is extended with additional material, patterned with open trenches, and the contacts 800 and 802 are deposited into the trenches. In some embodiments, the contacts 800 and 802 are overfilled into the trenches, forming overburdens above a surface of the dielectric region 700. In some embodiments, a CMP selective to the dielectric region 700 removes the overburden.

The contacts 800 and 802 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition. In some embodiments, the contacts 800 and 802 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 9:
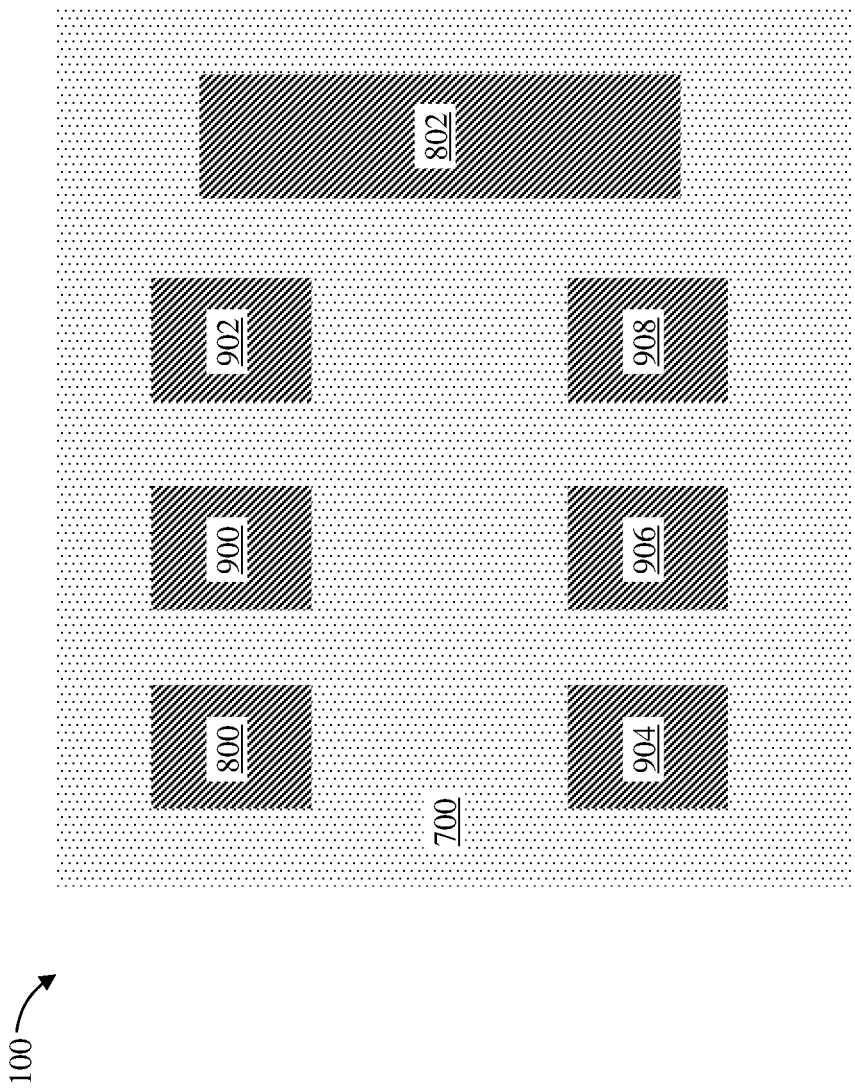
FIG. 9 depicts a top-down view of the structure after forming an array of nanosheet stacks each having a fuse region, a silicide region and a conductive contact formed according to one or more embodiments during an intermediate operation of a method of fabricating a semiconductor device.

FIG. 9 illustrates a top-down view of the structure 100 after forming an array of nanosheet stacks each having a fuse region, a silicide region and a conductive contact (e.g., conductive contacts 800, 900, 902, 904, 906, and 908) formed according to one or more embodiments during an intermediate operation of a method of fabricating a semiconductor device. For ease of discussion reference is made to operations performed on and to a structure 100 having an array of six nanosheet stacks (i.e., the nanosheet stacks in contact with the conductive contacts 800, 900, 902, 904, 906, and 908). It is understood, however, that the array can be formed to include any number of nanosheet stacks, and consequently, any number of required fuse regions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   a nanosheet stack formed on a substrate, the nanosheet stack comprising a semiconductor layer formed on a surface of the substrate, a nanosheet formed on the semiconductor layer, a modified semiconductor layer formed on the nanosheet, and a silicide region formed on the modified semiconductor layer;
   a silicide layer formed on the substrate and adjacent to the nanosheet stack;
   a first conductive contact formed on a surface of the silicide region; and
   a second conductive contact formed on a surface of the silicide layer.

2. The semiconductor device of claim 1, wherein the nanosheet comprises a thickness of about 4 nanometers to about 10 nanometers, and wherein the modified semiconductor layer comprises a thickness of about 6 nanometers to about 20 nanometers.

3. The semiconductor device of claim 1, wherein a concentration of Ge in the modified semiconductor layer is about 20 percent and a break down voltage of the modified semiconductor layer is about 2.8V.

4. The semiconductor device of claim 1, wherein a concentration of Ge in the modified semiconductor layer is about 30 percent and a break down voltage of the modified semiconductor layer is about 2.5V.

* * * * *